United States Patent
Wang et al.

(10) Patent No.: US 11,283,052 B2
(45) Date of Patent: Mar. 22, 2022

(54) DISPLAY PANEL AND METHOD FOR MANUFACTURING THE SAME BEING CAPABLE OF IMPROVING RELECTED LIGHT

(71) Applicant: BOE TECHNOLOGY GROUP CO., LTD., Beijing (CN)

(72) Inventors: Can Wang, Beijing (CN); Xiaochuan Chen, Beijing (CN); Minghua Xuan, Beijing (CN); Can Zhang, Beijing (CN); Ming Yang, Beijing (CN); Han Yue, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 494 days.

(21) Appl. No.: 16/326,463

(22) PCT Filed: Feb. 12, 2018

(86) PCT No.: PCT/CN2018/076487
§ 371 (c)(1),
(2) Date: Feb. 19, 2019

(87) PCT Pub. No.: WO2019/010981
PCT Pub. Date: Jan. 17, 2019

(65) Prior Publication Data
US 2021/0296619 A1   Sep. 23, 2021

(30) Foreign Application Priority Data
Jul. 14, 2017   (CN) .......................... 201710576534.2

(51) Int. Cl.
*H01L 29/08* (2006.01)
*H01L 51/52* (2006.01)
(Continued)

(52) U.S. Cl.
CPC .......... *H01L 51/5281* (2013.01); *H01L 51/56* (2013.01); *H01L 27/322* (2013.01);
(Continued)

(58) Field of Classification Search
CPC .................................................. H01L 51/5281
See application file for complete search history.

(56) References Cited

U.S. PATENT DOCUMENTS 6,737,800 B1* 5/2004 Winters ................. C09K 11/06
                                                    313/504
9,158,044 B2* 10/2015 Akiyama ............. G02B 5/0278
(Continued)

FOREIGN PATENT DOCUMENTS

CN      101900841 A    12/2010
CN      102576095 A     7/2012
(Continued)

OTHER PUBLICATIONS

PCT International Search Report; Application No. PCT/CN2018/076487; dated May 14, 2018; Form PCT/ISA/210 and PCT/ISA/237 with English Translation.
(Continued)

*Primary Examiner* — Caleb E Henry
(74) *Attorney, Agent, or Firm* — Nath, Goldberg & Meyer; Joshua B. Goldberg

(57) ABSTRACT

A display panel and a method for manufacturing the display panel are provided. The display substrate includes a plurality of sub-pixels; an anti-reflection layer provided on a light-exiting side of the display panel at positions respectively corresponding to the sub-pixels; a dielectric layer provided between the sub-pixels and the anti-reflection layer; the anti-reflection layer has a thickness enabling a first light and a second light to be not in-phase; the first light is a portion of ambient light reflected by a surface of the anti-reflection
(Continued)

layer away from the sub-pixel; the second light is a portion of the ambient light sequentially refracted by and passing through the surface of the anti-reflection layer away from the sub-pixel, entering the anti-reflection layer, reflected by an interface between the anti-reflection layer and the dielectric layer, refracted by the surface of the anti-reflection layer away from the sub-pixel and entering environment.

19 Claims, 3 Drawing Sheets

(51) Int. Cl.
  *H01L 51/56* (2006.01)
  *H01L 27/32* (2006.01)
(52) U.S. Cl.
  CPC ....... *H01L 27/3211* (2013.01); *H01L 27/3244* (2013.01); *H01L 2227/323* (2013.01)

(56) References Cited

U.S. PATENT DOCUMENTS

| | | | |
|---|---|---|---|
| 2003/0067266 A1* | 4/2003 | Kim | H01L 51/5284 313/504 |
| 2003/0222857 A1* | 12/2003 | Abileah | G06F 3/0488 345/173 |
| 2005/0006652 A1* | 1/2005 | Pai | H01L 51/5281 257/79 |
| 2006/0138946 A1* | 6/2006 | Wang | H01L 51/5281 313/506 |
| 2006/0267485 A1* | 11/2006 | Wood | H01L 51/5281 313/504 |
| 2008/0049431 A1* | 2/2008 | Boek | H01L 51/5281 362/311.06 |
| 2008/0258614 A1* | 10/2008 | Ha | G02B 5/3058 313/504 |
| 2009/0268299 A1* | 10/2009 | Furui | G02B 5/0242 359/601 |
| 2010/0027126 A1* | 2/2010 | Chen | G02B 5/0226 359/601 |
| 2010/0052521 A1* | 3/2010 | Kim | H01L 27/323 313/504 |
| 2011/0217541 A1* | 9/2011 | Shimano | C09D 7/62 428/323 |
| 2012/0200933 A1 | 8/2012 | Akiyama et al. | |
| 2012/0287108 A1* | 11/2012 | Oh | G02F 1/133555 345/212 |
| 2012/0319151 A1* | 12/2012 | Cho | H01L 51/5281 257/98 |
| 2014/0361682 A1* | 12/2014 | Cho | H05B 33/10 313/509 |
| 2015/0137093 A1* | 5/2015 | Yang | H01L 27/3244 257/40 |
| 2016/0079567 A1* | 3/2016 | Cho | H01L 51/5284 257/40 |
| 2017/0307936 A1* | 10/2017 | Tseng | G02F 1/133514 |
| 2018/0241008 A1* | 8/2018 | Kang | H01L 51/5281 |
| 2018/0246605 A1 | 8/2018 | Zhou | |
| 2018/0248150 A1* | 8/2018 | Oh | H01L 27/323 |

FOREIGN PATENT DOCUMENTS

| | | |
|---|---|---|
| CN | 107331688 A | 11/2017 |
| CN | 106201071 A | 12/2017 |

OTHER PUBLICATIONS

First Office Action of CN; Application No. 201710576534.2; dated Jun. 29, 2018; English Translation Attached.
Tang, Jinfa et al., "Thin Film Optics and Technology", Chine Machine Press; pp. 42-43; Jun. 30, 1989; With English Translation.
Li Luhai, "Printed Packaging Functional Materials", China Light Industry Publishing House; pp. 201-202; Jan. 31, 2013; With English Translation.

* cited by examiner

DISPLAY PANEL AND METHOD FOR MANUFACTURING THE SAME BEING CAPABLE OF IMPROVING RELECTED LIGHT

CROSS-REFERENCE TO RELATED APPLICATION

This is a National Phase Application filed under 35 U.S.C. 371 as a national stage of PCT/CN2018/076487, filed Feb. 12, 2018, an application claiming the benefit of Chinese Patent Application No. 201710576534.2 filed on Jul. 14, 2017, the disclosure of which is hereby incorporated by reference.

TECHNICAL FIELD

The present disclosure relates to the field of display device processing technology, and in particular, to a display panel and a method for manufacturing the display panel.

BACKGROUND

An organic light emitting display (OLED) refers to a structure in which an organic semiconductor material and a light-emitting material are driven by an electric field to emit light through carriers injection and recombination. OLED has a series of advantages such as active light-emitting, having no viewing-angle problem, light weight, small thickness, high brightness, high light-emitting efficiency, fast response speed, high dynamic picture quality, wide usage temperature range, being capable of flexibly displaying, simple process, low cost and high anti-vibration capability.

SUMMARY

The present disclosure provides a display panel including: a plurality of sub-pixels; an anti-reflection layer provided on a light-exiting side of the display panel at positions respectively corresponding to the sub-pixels; a dielectric layer provided between the sub-pixels and the anti-reflection layer, the anti-reflection layer has a thickness enabling a first light and a second light to be not in-phase; the first light is a portion of ambient light being reflected by a surface of the anti-reflection layer away from the sub-pixels; the second light is a portion of ambient light sequentially refracted by and passing through the surface of the anti-reflection layer away from the sub-pixels, entering the anti-reflection layer, reflected by an interface between the anti-reflection layer and the dielectric layer, refracted by the surface of the anti-reflection layer away from the sub-pixels and entering environment.

In some implementations, the anti-reflection layer has a refractive index smaller than a refractive index of the dielectric layer but greater than a refractive index of the environment.

In some implementations, the refractive index n of the anti-reflection layer is calculated according to the following equation:

$$n^2 = n1*n2, \text{ where } n1 \text{ is the refractive index of the environment; } n2 \text{ is the refractive index of the dielectric layer.}$$

In some implementations, a thickness d of the anti-reflection layer is calculated according to the following equation:

$$nd = (2k+1)\lambda/4, (k=1,2,3,4\ldots)$$

where n is the refractive index of the anti-reflection layer, and $\lambda$ is a wavelength of light emitted by the sub-pixels.

In some implementations, the dielectric layer is glass.

In some implementations, the anti-reflection layer is made of a material including at least one of $SiO_2$, $MgF_2$ and an organic resin having a refractive index less than 1.5.

In some implementations, a coating layer is provided at a position corresponding to each of the sub-pixels on the light-exiting side of the display panel, the coating layer has a color consistent with said each of the sub-pixels.

In some implementations, the coating layer is provided on a surface of the anti-reflection layer away from the dielectric layer.

In some implementations, the anti-reflection layer or the dielectric layer is filled with auxiliary particles, a wavelength of light transmitted by the sub-pixels is positively correlated with diameters of the auxiliary particles.

In some implementations, the auxiliary particles include at least one kind of Ag particles, Au particles and Si particles.

In some implementations, the display panel further includes a substrate made of a monocrystalline silicon material and an active driving circuit formed on the substrate, the sub-pixels are OLED light-emitting sub-pixels; and the active driving circuit is configured to drive the OLED light emitting sub-pixels to operate.

The present disclosure provides a method for manufacturing a display panel, including the steps of: providing a dielectric layer and an anti-reflection layer at positions on a light-exiting side of the display panel respectively corresponding to sub-pixels, the dielectric layer being provided between the sub-pixels and the anti-reflection layer; the anti-reflection layer has a thickness enabling a first light and a second light to be not in-phase; the first light is a portion of ambient light being reflected by a surface of the anti-reflection layer away from the sub-pixels; the second light is a portion of the ambient light sequentially refracted by and passing through the surface of the anti-reflection layer away from the sub-pixel, entering the anti-reflection layer, reflected by an interface between the anti-reflection layer and the dielectric layer, refracted by the surface of the anti-reflection layer away from the sub-pixels and entering environment.

In some implementations, the anti-reflection layer has a refractive index smaller than a refractive index of the dielectric layer but greater than a refractive index of the environment.

In some implementations, the refractive index n of the anti-reflection layer is calculated according to the following equation:

$$n^2 = n1*n2, \text{ where}$$

n1 is the refractive index of the environment;
n2 is the refractive index of the dielectric layer.

In some implementations, a thickness d of the anti-reflection layer is calculated according to the following equation:

$$nd = (2k+1)\lambda/4, (k=1,2,3,4\ldots)$$

where n is the refractive index of the anti-reflection layer; and $\lambda$ is a wavelength of light emitted by the sub-pixels.

In some implementations, the method for manufacturing the display panel further includes a step of: providing a coating layer at a position corresponding to each of the sub-pixels on the light-exiting side of the display panel, the coating layer has a color consistent with a color of said each of the sub-pixels.

In some implementations, the coating layer is provided on a surface of the anti-reflection layer away from the dielectric layer.

In some implementations, the method for manufacturing the display panel further includes a step of: filling auxiliary particles into the anti-reflection layer or the dielectric layer, a wavelength of light transmitted by the sub-pixels is positively correlated with diameters of the auxiliary particles.

In some implementations, the method for manufacturing the display panel further includes steps of: providing a substrate formed of a monocrystalline silicon material; forming an active driving circuit on the substrate by using a CMOS process; forming the sub-pixels on the active driving circuit, the sub-pixels being OLED sub-pixels, and the active driving circuit being capable of driving the sub-pixels to operate.

DETAILED DESCRIPTION

Micro-displays have developed in recent years and can be applied to head-mounted video players, head-mounted home theaters, head-mounted virtual reality simulators, head-mounted game consoles, pilot helmet systems, individual combat systems, infrared night vision devices, head-mounted medical diagnostic systems and the like. At present, an existing micro OLED display has a technical problem that ambient light is reflected on a surface of the display and thus displaying is affected.

The present disclosure aims to solve at least one of technical problems existing in the related art, and provides a display panel and a method for manufacturing the display panel, which can improve the reflection of ambient light well or to some extent, and can also enhance intensity of light emitted by the pixels. In addition, an anti-reflection layer can be used as the outermost structure of the display panel, and therefore the display panel can also be protected.

In order to enable those skilled in the art to better understand the technical solutions of the present disclosure, the display panel and the method for manufacturing the display panel provided by the present disclosure are described in detail below with reference to the accompanying drawings.

Figure 1:
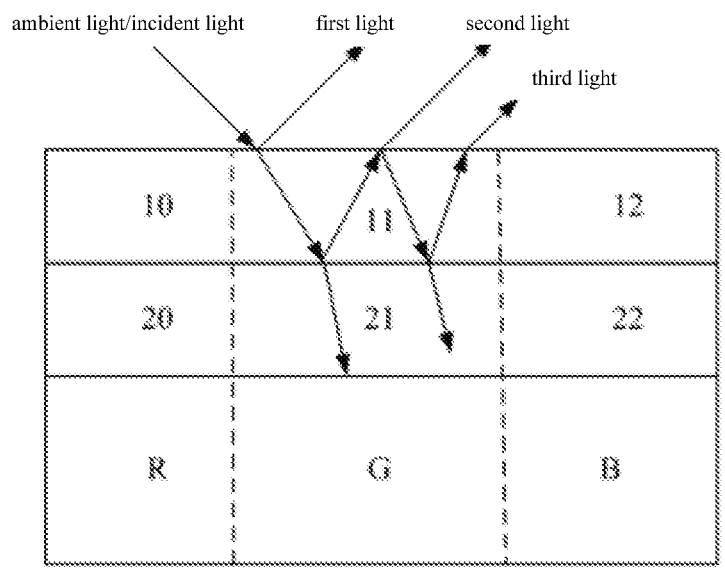
FIG. 1 is a schematic diagram of a display panel reflecting ambient light according to an embodiment of the present disclosure.

FIG. 1 is a schematic diagram of a display panel reflecting ambient light according to an embodiment of the present disclosure. Referring to FIG. 1, the display panel provided in the present embodiment includes a plurality of sub-pixels, for example, a red sub-pixel R, a blue sub-pixel B and a green sub-pixel G as shown in FIG. 1. Each of the sub-pixels is provided with a corresponding anti-reflection layer, such as the anti-reflection layers 10-12 as shown in FIG. 1, on a light-exiting side of the sub-pixel. A dielectric layer, such as the dielectric layer 20-22 as shown in FIG. 1, is provided between the sub-pixels and the corresponding anti-reflection layer.

For example, the red sub-pixel R is taken as an example, and the green sub-pixel G and the blue sub-pixel B are similar to the red sub-pixel R. A thickness of the anti-reflection layer 10 corresponding to the red sub-pixel R is set so that a first light and a second light are not in-phase, the first light is a portion of ambient light being reflected by a surface of the anti-reflection layer away from the sub-pixel; and the second light is a portion of the ambient light sequentially refracted by and passing through the surface of the anti-reflection layer away from the sub-pixel, entering the anti-reflection layer, reflected by an interface between the anti-reflection layer and the dielectric layer, and refracted by the surface of the anti-reflection layer away from the sub-pixel and entering the environment (as shown in FIG. 1). The so-called being not in-phase includes being reversed-phase (a phase difference therebetween is $\pi$) and multiple cases between in-phase and reversed-phase (i.e., a phase difference is between 0 and $\pi$, but does not include 0 and $\pi$).

In the present disclosure, since the phases of the first light and the second light are related to the thickness of the anti-reflection layer, the thickness of the anti-reflection layer is set such that the first light and the second light are in reversed-phase, so that the first light and the second light cancel each other well through their interfering with each other, therefore, the reflection of the ambient light can be improved. Moreover, the thickness of the anti-reflection layer is set such that the phase difference between the first light and the second light is between 0 and $\pi$, the first light and the second light can cancel each other to some extent through their interfering with each other, so that the reflection of the ambient light can be improved to some extent. In addition, the anti-reflection layer can be used as the outermost structure of the display panel, and therefore, the display panel can also be protected.

It should be noted that only the first light and the second light are considered herein, regardless of a third light that is a portion of the ambient light being refracted by the surface of the anti-reflection layer away from the sub-pixel and entering the anti-reflection layer, reflected twice at the interface between the anti-reflection layer and the medium, and refracted by the surface of the anti-reflection layer away from the sub-pixel and entering the environment, for example, a transmission path of the third light is indicated by an arrow in FIG. 1, because an intensity of the third light at this time is small and thus may be not be taken into account.

In some implementations, taking the red sub-pixel R as an example, the green sub-pixel G and the blue sub-pixel B are similar to the red sub-pixel R, and the anti-reflection layer 10 corresponding to the red sub-pixel R has a refractive index smaller than that of the dielectric layer 20 but larger than a refractive index of the environment which is generally 1. Thus, amplitudes of the first light and the second light are close to each other, facilitating the cancellation of the first light and the second light through interference therebetween.

Furthermore, in some implementations, the refractive index n of the anti-reflection layer is calculated according to the following formula: $n^2=n1*n2$, where n1 is the refractive index of the environment; n2 is the refractive index of the dielectric layer. The anti-reflection layer 10 having the refractive index n calculated by the formula can make the amplitudes of the first light and the second light closest to each other, thereby facilitating the cancellation of the first light and the second light through interference therebetween.

Furthermore, in some implementations, in order to realize the reversed-phase of the first light and the second light, in the case where the refractive index of the anti-reflection layer 10 is smaller than the refractive index of the dielectric layer 20 but greater than the refractive index of the environment, the thickness d of the anti-reflection layer is calculated by the following formula: $nd=(2+1)\lambda/4$, ($k=1, 2, 3, 4 \ldots$) where n is the refractive index of the anti-reflection layer; $\lambda$ is a wavelength of light propagating in the anti-reflection layer.

A detailed process of obtaining the formula is explained below. For example, considering the case where the ambient light is incident vertically, when the vertical incident ambient light is incident on the anti-reflection layer, since the refractive index of the anti-reflection layer 10 is smaller than the refractive index of the dielectric layer 20 but larger than the refractive index of the environment, a half-wave loss occurs when the ambient light is reflected at the surface of the anti-reflection layer away from the sub-pixel and at the interface between the anti-reflection layer and the dielectric layer. Therefore, an optical path difference between the first light and the second light is 2nd, and the condition where the first light and the second light are reversed-phase is: $2nd=k\lambda+(\frac{1}{2})\lambda=2(2k+1)(\frac{1}{4})\lambda$, thus it can be derived that $nd=(2k+1)\lambda/4$, ($k=1, 2, 3, 4 \ldots$).

Here, in a case where the thickness of the anti-reflection layer 10 corresponding to the red sub-pixel R is calculated by the above formula, the thickness of the anti-reflection layer 10 can be obtained by substituting the wavelength X of the red light into the above formula. Thus, on one hand, the resulted anti-reflection layer 10 weakens red light in the reflected light and improves the reflection of ambient light. On the other hand, since a portion of red light emitted by the red sub-pixel, reflected by the interface between the anti-reflection layer 10 and the dielectric layer and entering into the dielectric layer and a portion of the red light emitted by the red sub-pixel, reflected by the surface of the anti-reflection layer 10 away from the sub-pixel and emitting towards the dielectric layer can also cancel each other through interference therebetween, therefore, the resulted anti-reflection layer 10 can also enhance the transmission of red light emitted by the red sub-pixel R, thereby increasing the intensity of red light emitted by the red sub-pixel R. For vertical incident ambient light, the red light in the vertical incident ambient light can be completely cancelled. In addition, for obliquely incident ambient light, the red light in the obliquely incident ambient light can be cancelled to a certain extent through interference. Therefore, cross-color and color mixing phenomenon between reflected light of a sub-pixel and light emitted by adjacent sub-pixels are avoided to some extent (for example, the reflected red light is prevented from appearing above the anti-reflection layer corresponding to the green sub-pixel to some extent, thereby avoiding the phenomenon of cross-color and color mixing between the reflected red light and the green light emitted by the green sub-pixel).

Figure 2:
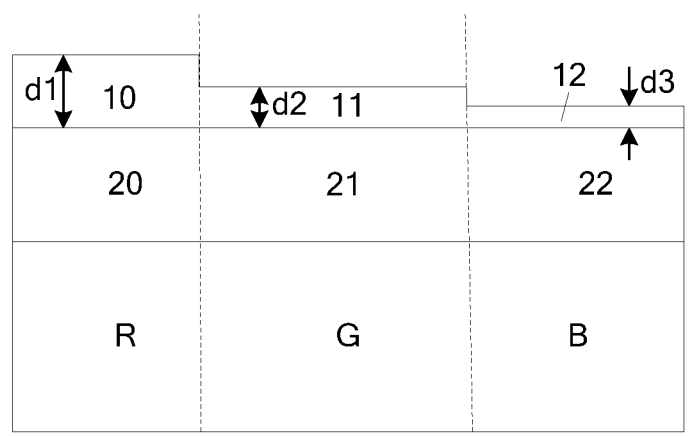
FIG. 2 is a schematic structural diagram of a display panel according to an embodiment of the present disclosure.

It should be noted that dielectric layers corresponding to different sub-pixels may be the same, and refractive indices of anti-reflection layers corresponding to different sub-pixels may also be the same. Since different sub-pixels emit light of different colors, wavelengths of light of different colors are different, therefore, thicknesses d of the anti-reflection layers corresponding to different sub-pixels are different, as shown in FIG. 2. Since a wavelength of the red light emitted by the red sub-pixel R, a wavelength of green light emitted by the green sub-pixel G, and a wavelength of blue light emitted by the blue sub-pixel B meet the following relationship: the wavelength of red light>the wavelength of green light>the wavelength of blue light, therefore, the thicknesses d of the anti-reflection layers 10-12 corresponding to the red sub-pixel R, the green sub-pixel G and the blue sub-pixel B meet the following relationship: d1>d2>d3 (where d1 is the thickness of the anti-reflection layer 10 corresponding to the red sub-pixel R, d2 is the thickness of the anti-reflection layer 11 corresponding to the green sub-pixel G, and d3 is the thickness of the anti-reflection layer 12 corresponding to the blue sub-pixel B).

In addition, it should be rioted that the value of k can be specifically set according to actual process, and the smaller the value of k is, the smaller the thickness d of the anti-reflection layer is, and the lighter and thinner the display panel is.

In the present embodiment, the dielectric layers 20-22 is glass, thus the dielectric layers have a refractive index of 1.5, and by adopting glass as the dielectric layers, the dielectric layers are low in cost and easy to be manufactured. Certainly, in practical applications, the dielectric layers 20-22 may also be made of other transparent materials capable of transmitting light emitted by the sub-pixels, which are not enumerated here.

In addition, in a case where the dielectric layer is glass (which has a refractive index of 1.5), the anti-reflection layer is made of a material having a refractive index between 1 and 1.5. Therefore, the material used for the anti-reflection layer may include at least one of $SiO_2$ (refractive index of which ranges from 1.3 to 1.4), $MgF_2$ (refractive index of which is 1.38) and an organic resin having a refractive index less than 1.5.

In the present embodiment, in order to further avoid cross-color and color mixing between different sub-pixels, a coating layer of a corresponding color is provided at a position corresponding to each of the sub-pixels and on the light-exiting side. For example, a red coating layer is provided at the position corresponding to the red sub-pixel so that only red light is allowed to exit from the coating. Specifically, the specific arrangement position of the coating layer is not limited, as long as it is ensured that the light emitted from each of the sub-pixels can pass through the corresponding coating layer. For example, in an embodiment, the coating layer is provided on the surface of the anti-reflection layer away from the sub-pixel.

In practical applications, in order to further avoid cross-color and color mixing between different sub-pixels, auxiliary particles may also be filled in the anti-reflection layers or in the dielectric layers. The wavelength of light emitted by different sub-pixels is positively correlated with the diameter of the auxiliary particle. Specifically, the larger the wavelength of the light is, the larger the diameters of the auxiliary particles are set. Therefore, the relationship among the diameters of the auxiliary particles for the red sub-pixel R, the green sub-pixel G, and the blue sub-pixel B is: the diameters of the auxiliary particles for the red sub-pixel R>the diameters of the auxiliary particles for the green sub-pixel G>the diameters of the auxiliary particles for the blue sub-pixel B. Specifically, the auxiliary particles include, but not limited to, at least one kind of Ag particles, Au particles, and Si particles.

Figure 3:
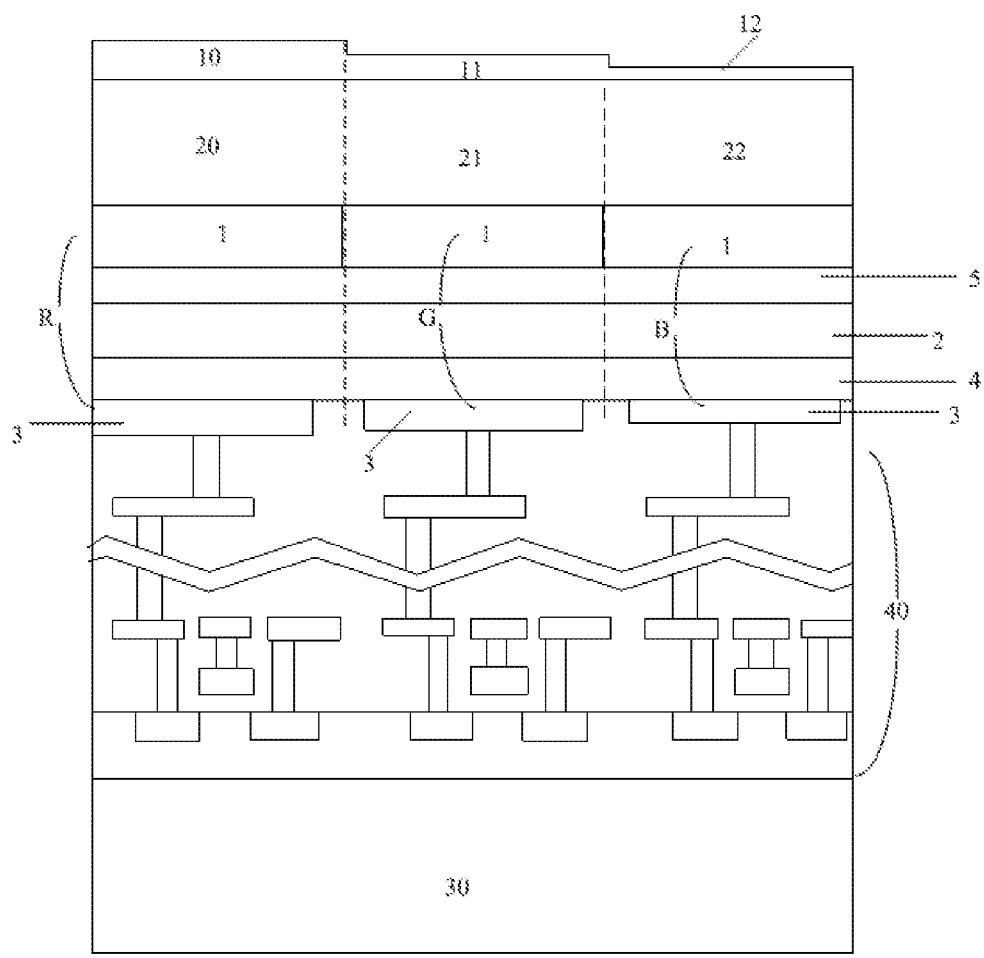
FIG. 3 is a schematic structural diagram illustrating details of a display panel according to an embodiment of the present disclosure.

FIG. 3 is a schematic diagram of a specific structure of a display panel according to an embodiment of the present disclosure. Referring to FIG. 3, the display panel is an active organic light emitting diode micro display panel manufactured by using an active driving backplane made of monocrystalline silicon. Specifically, the display panel includes: a substrate 30 formed of a monocrystalline silicon material, an active driving circuit 40 manufactured on the substrate 30, and sub-pixels which are OLED light emitting sub-pixels, and the active driving circuit is configured to drive the OLED light emitting sub-pixels to operate.

Each of the OLED light-emitting sub-pixels includes a color filter block 1 and a self-light-emitting element, the color filter block is provided on a light-exiting side of the self-light-emitting element. The self-light-emitting element generally includes a first electrode 2, a second electrode 3, and a light emitting functional layer 4 provided between the first electrode 2 and the second electrode 3. Generally, an encapsulation layer 5 is further provided between the color filter block 1 and the self-light-emitting element.

The display panel shown in FIG. 3 is an active organic light emitting diode micro-display panel manufactured by using an active driving backplane made of monocrystalline silicon. Since the monocrystalline silicon has high mobility, the micro-display with high resolution and high system integration can be obtained. In addition, a mature CMOS process may be adopted to design driving transistors and the sub-pixels as a three-dimensional structure (as shown in FIG. 3) to reduce the display volume and increase the aperture ratio.

Figure 4:
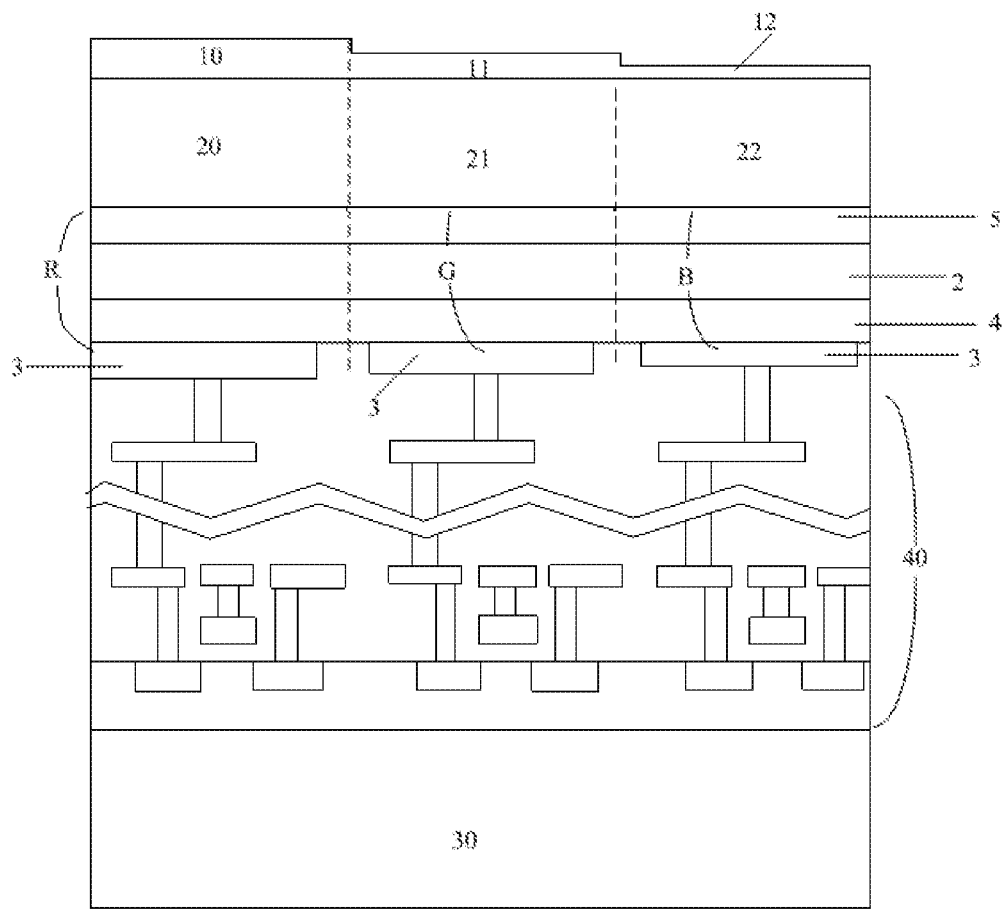
FIG. 4 is another schematic structural diagram illustrating details of a display panel according to another embodiment of the present disclosure.

It should be noted that, in practical applications, as shown in FIG. 4, each of the OLED light-emitting sub-pixels includes a first electrode 2, a second electrode 3 and a light-emitting functional layer 4 provided between the first electrode 2 and the second electrode 3. Light-emitting functional layers 4 of the different sub-pixels emit light of different colors, and the encapsulation layer 5 is provided between the dielectric layer and the first electrode 2. In such case, compared with the structure shown in FIG. 3, the color filter block 1 is not required to be provided. Certainly, in practical applications, the display panel provided by the embodiment of the present disclosure may be a liquid crystal display panel, including an array substrate and a color filter substrate assembled to form a cell, and a liquid crystal layer provided between the array substrate and the color filter substrate.

With reference to FIG. 1 to FIG. 3, an embodiment of the present disclosure further provides a method for manufacturing a display panel, including the following steps: providing dielectric layers and anti-reflection layers at positions on a light-exiting side of the display panel corresponding to sub-pixels respectively, each of the dielectric layers being provided between one of the sub-pixels and corresponding one of the anti-reflection layers, for example, as shown in FIG. 1, the dielectric layer 20 is provided between the red sub-pixel R. and the anti-reflection layer 10, the dielectric layer 21 is provided between the green sub-pixel G and the anti-reflection layer 11, and the dielectric layer 22 is provided between the blue sub-pixel B and the anti-reflection layer 12.

Each of anti-reflection layers has a thickness enabling a first light and a second light to be not in-phase, the first light is a portion of ambient light reflected by a surface of the anti-reflection layer away from the sub-pixel; the second light is a portion of the ambient light sequentially refracted by and passing through the surface of the anti-reflection layer away from the sub-pixel, entering the anti-reflection layer, reflected twice by an interface between the anti-reflection layer and the dielectric layer, refracted by the surface of the anti-reflection layer away from the sub-pixel and entering the environment.

Since the operation principle of the manufacturing method provided by the embodiment is the same as that of the display panel provided in the above embodiment, and has been described in detail in the above embodiment, it will not be described again here (hereinafter, the principle and effect of technical features the same as those in the above embodiments are also not described).

Optionally, the anti-reflection layer has a refractive index smaller than a refractive index of the dielectric layer but greater than a refractive index of the environment.

Optionally, the refractive index n of the anti-reflection layer is calculated according to the following equation: $n^2=n1*n2$, where n1 is the refractive index of the environment, and n2 is the refractive index of the dielectric layer.

Optionally, a thickness d of the anti-reflection layer is calculated according to the following equation: $nd=(2k+1)\lambda/4$, (k=1, 2, 3, 4 . . . ) where n is the refractive index of the anti-reflection layer, and $\lambda$ is a wavelength of light emitted by the sub-pixels.

Optionally, the dielectric layer is glass.

Optionally, a material of the anti-reflection layer includes at least one kind of $SiO_2$, $MgF_2$ and an organic resin having a refractive index less than 1.5.

Optionally, the method further includes a step of: providing coating layers, each of which having a color consistent with a color of corresponding one of the sub-pixels, at positions corresponding to the sub-pixels on the light-emitting side of the display panel. For example, in an embodiment, the coating layers are provided on surfaces of the anti-reflection layer away from the sub-pixels.

Optionally, the method further includes a step of: filling auxiliary particles into the anti-reflection layers or the dielectric layers, wavelengths of light transmitted by the sub-pixels are positively correlated with diameters of the auxiliary particles.

Optionally, the auxiliary particles include at least one kind of Ag particles, Au particles and Si particles.

Optionally, the method further includes the following steps of: providing a substrate formed of a monocrystalline silicon material; forming an active driving circuit on the substrate by using a CMOS process; forming the sub-pixels on the active driving circuit, the sub-pixels being OLED sub-pixels, and the active driving circuit being capable of driving the sub-pixels to operate.

It should be understood that, the foregoing embodiments are only exemplary embodiments used for explaining the principle of the present disclosure, but the present disclosure is not limited thereto. Various variations and improvements may be made by a person skilled in the art without departing from the spirit and essence of the present disclosure, and these variations and improvements also fall into the protection scope of the present disclosure.

The invention claimed is:

1. A display panel, comprising:
a plurality of sub-pixels;
an anti-reflection layer provided on a light-exiting side of the display panel at positions respectively corresponding to the sub-pixels;
a dielectric layer provided between the sub-pixels and the anti-reflection layer;
wherein the anti-reflection layer has a thickness enabling a first light and a second light to be not in-phase;
the first light is a portion of ambient light reflected by a surface of the anti-reflection layer away from the sub-pixels;
the second light is a portion of the ambient light sequentially refracted by and passing through the surface of the anti-reflection layer away from the sub-pixels, entering the anti-reflection layer, reflected by an interface between the anti-reflection layer and the dielectric layer, and refracted by the surface of the anti-reflection layer away from the sub-pixels and entering environment, and wherein the anti-reflection layer or the dielectric layer is filled with auxillary particles, and a wavelength of light transmitted by the sub-pixels is positively correlated with diameters of the auxillary particles.

2. The display panel according to claim 1, wherein the anti-reflection layer has a refractive index smaller than a refractive index of the dielectric layer but greater than a refractive index of the environment.

3. The display panel according to claim 2, wherein the refractive index n of the anti-reflection layer is calculated according to the following equation:

$n^2 = n1*n2$, where n1 is the refractive index of the environment;
n2 is the refractive index of the dielectric layer.

4. The display panel according to claim 2, wherein a thickness d of the anti-reflection layer is calculated according to the following equation:

$nd = (2k+1)\lambda/4$, $(k=1,2,3,4 \ldots)$ where n is the refractive index of the anti-reflection layer, and $\lambda$ is a wavelength of light emitted by the sub-pixels.

5. The display panel according to claim 1, wherein the dielectric layer is glass.

6. The display panel according to claim 1, wherein the anti-reflection layer is made of a material including at least one of $SiO_2$, $MgF_2$ and an organic resin having a refractive index less than 1.5.

7. The display panel according to claim 1, wherein a coating layer having a color consistent with a color of corresponding one of the sub-pixels is provided at a position corresponding to the corresponding one of the sub-pixels on the light-exiting side of the display panel.

8. The display panel according to claim 7, wherein the coating layer is provided on a surface of the anti-reflection layer away from the dielectric layer.

9. The display panel according to claim 1, wherein the auxiliary particles include at least one kind of Ag particles, Au particles and Si particles.

10. The display panel according to claim 1, further comprising: a substrate made of a monocrystalline silicon material and an active driving circuit formed on the substrate, wherein the sub-pixels are OLED light-emitting sub-pixels; and
the active driving circuit is configured to drive the OLED light emitting sub-pixels to operate.

11. A method for manufacturing a display panel, comprising steps of:

providing a dielectric layer and an anti-reflection layer at positions on a light-exiting side of the display panel respectively corresponding to sub-pixels, the dielectric layer being provided between the sub-pixels and the anti-reflection layer;

wherein the anti-reflection layer has a thickness enabling a first light and a second light to be not in-phase;

the first light is a portion of ambient light reflected by a surface of the anti-reflection layer away from the sub-pixel;

the second light is a portion of the ambient light sequentially refracted by and passing through the surface of the anti-reflection layer away from the sub-pixel, entering the anti-reflection layer, reflected by an interface between the anti-reflection layer and the dielectric layer, and refracted by the surface of the anti-reflection layer away from the sub-pixel and entering environment.

12. The method for manufacturing the display panel according to claim 11, wherein the anti-reflection layer has a refractive index smaller than a refractive index of the dielectric layer but greater than a refractive index of the environment.

13. The method for manufacturing the display panel according to claim 12, wherein the refractive index n of the anti-reflection layer is calculated according to the following equation:

$n^2 = n1*n2$, where n1 is the refractive index of the environment;
n2 is the refractive index of the dielectric layer.

14. The method for manufacturing the display panel according to claim 12, wherein a thickness d of the anti-reflection layer is calculated according to the following equation:

$nd = (2k+1)\lambda/4$, $(k=1,2,3,4 \ldots)$ where n is the refractive index of the anti-reflection layer; and $\lambda$ is a wavelength of light emitted by the sub-pixels.

15. The method for manufacturing the display panel according to claim 13, wherein a thickness d of the anti-reflection layer is calculated according to the following equation:

$nd = (2k+1)\lambda/4$, $(k=1,2,3,4 \ldots)$ where n is the refractive index of the anti-reflection layer; and $\lambda$ is a wavelength of light emitted by the sub-pixels.

16. The method for manufacturing the display panel according to claim 11, further including a step of:

providing a coating layer having a color consistent with a color of corresponding one of the sub-pixels, at a position corresponding to the corresponding one of the sub-pixels on the light-exiting side of the display panel.

17. The method for manufacturing the display panel according to claim 11, the coating layer is provided on a surface of the anti-reflection layer away from the sub-pixel.

18. The method for manufacturing the display panel according to claim 11, further including a step of:

filling auxiliary particles into the anti-reflection layer or the dielectric layer, wherein a wavelength of light emitted by the sub-pixels is positively correlated with diameters of the auxiliary particles.

19. The method for manufacturing the display panel according to claim 11, further including steps of:

providing a substrate formed of a monocrystalline silicon material;

forming an active driving circuit on the substrate by using a CMOS process;

forming the sub-pixels on the active driving circuit, wherein the sub-pixels being OLED sub-pixels, and the active driving circuit being capable of driving the sub-pixels to operate.

* * * * *